(12) United States Patent
Lee et al.

(10) Patent No.: US 8,912,848 B2
(45) Date of Patent: Dec. 16, 2014

(54) DIGITAL PRE-DISTORTION DEVICE AND METHOD FOR A BROADBAND POWER AMPLIFIER

(75) Inventors: Yong Hoon Lee, Daejeon (KR); Sung Ho Choi, Gyeonggi-do (KR); Eui Rim Jeong, Daejeon (KR)

(73) Assignee: Korea Advanced Institute of Science and Technology, Daejeon (KR)

( * ) Notice: Subject to any disclaimer, the term of this patent is extended or adjusted under 35 U.S.C. 154(b) by 130 days.

(21) Appl. No.: 13/695,985

(22) PCT Filed: Jun. 18, 2010

(86) PCT No.: PCT/KR2010/003951
§ 371 (c)(1),
(2), (4) Date: Dec. 17, 2012

(87) PCT Pub. No.: WO2011/139002
PCT Pub. Date: Nov. 10, 2011

(65) Prior Publication Data
US 2013/0200948 A1 Aug. 8, 2013

(30) Foreign Application Priority Data
May 3, 2010 (KR) .......................... 10-2010-0041263

(51) Int. Cl.
*H03F 1/26* (2006.01)
*H03F 1/32* (2006.01)
(Continued)

(52) U.S. Cl.
CPC ............ *H03F 1/3241* (2013.01); *H03F 1/3247* (2013.01); *H03F 3/189* (2013.01); *H03F 3/24* (2013.01); *H04B 1/0475* (2013.01); *H03F 1/3258* (2013.01); *H03F 3/245* (2013.01); *H03F 2200/36* (2013.01); *H03F 2200/39* (2013.01); *H04L 27/2601* (2013.01); *H04W 16/14* (2013.01); *H04L 25/03878* (2013.01); *H04L 27/0006* (2013.01); *H04B 2001/0425* (2013.01)
USPC ........................................................ 330/149

(58) Field of Classification Search
CPC ..................................................... H03F 1/3252
USPC ..................................................... 455/114.3
See application file for complete search history.

(56) References Cited

U.S. PATENT DOCUMENTS 6,476,670 B1 * 11/2002 Wright et al. ...................... 330/2
7,336,725 B2 2/2008 Cova (Continued)

FOREIGN PATENT DOCUMENTS

| KR | 10-2005-0108024 A | 11/2005 |
|---|---|---|
| KR | 10-2007-0017273 A | 2/2007 |

*Primary Examiner* — Steven J Mottola
(74) *Attorney, Agent, or Firm* — Rabin & Berdo, P.C.

(57) ABSTRACT

According to the present invention, a digital pre-distortion device and method for use in a dynamic spectrum allocation system, which uses a breadband frequency range, such as a cognitive radio (CR) system, are implemented. Also, while as conventional pre-distortion device only enable the linearization of a signal of a fundamental frequency band, the digital pre-distortion device and method according to the present invention enable not only the linearization of a basic signal on frequency $f_c$, but also simultaneously enable the elimination of harmonic signals on the high frequencies of $2f_c$, $3f_c$, $4f_c$, etc. The digital pre-distortion device for a broadband power amplifier according to a preferred embodiment of the present invention comprises: a nonlinear power amplifier; an equivalent amplifier model estimator; N pre-distorters; and a coefficient extractor for extracting the coefficients of the N pre-distorters.

17 Claims, 12 Drawing Sheets

| (51) | Int. Cl. | |
|---|---|---|
| | *H03F 3/189* | (2006.01) |
| | *H03F 3/24* | (2006.01) |
| | *H04B 1/04* | (2006.01) |
| | H04L 27/26 | (2006.01) |
| | H04W 16/14 | (2009.01) |
| | H04L 25/03 | (2006.01) |
| | H04L 27/00 | (2006.01) |

(56) References Cited

U.S. PATENT DOCUMENTS

| 7,590,394 | B2 | 9/2009 | Choi et al. |
| 2005/0195919 | A1 | 9/2005 | Cova |
| 2005/0253745 | A1 | 11/2005 | Song et al. |
| 2007/0032208 | A1 | 2/2007 | Choi et al. |

\* cited by examiner

| OUTPUT | INTERMODULATION TERM |
|---|---|
| DC TERM | $\frac{\alpha_1}{2^1}(2|y_1|^2 + 2|y_2|^2 + 2|y_3|^2)$ $+\frac{\alpha_3}{2^3}(3y_1^2 y_2^* + 3y_1^{*2} y_2 + 6y_1 y_2 y_3^* + 6y_1^* y_2^* y_3)$ |
| FUNDAMENTAL SIGNAL | $\frac{\alpha_1}{2}y_1 + \frac{\alpha_2}{2^2}(2y_1^* y_2 + 2y_2^* y_3)$ $+\frac{\alpha_3}{2^3}(3y_1|y_1|^2 + 3y_2^2 y_3^* + 3y_1^{*2} y_3 + 6y_1|y_2|^2 + 6y_1|y_3|^2)$ |
| SECOND HARMONIC | $\frac{\alpha_1}{2}y_2 + \frac{\alpha_2}{2^2}(y_1^2 + 2y_1^* y_3)$ $+\frac{\alpha_3}{2^3}(3y_2|y_2|^2 + 6y_2|y_1|^2 + 6y_2|y_3|^2 + 6y_1 y_2^* y_3)$ |
| THIRD HARMONIC | $\frac{\alpha_1}{2}y_3 + \frac{\alpha_2}{2^2} 2y_1 y_2$ $+\frac{\alpha_3}{2^3}(y_1^3 + 3y_1^* y_2^2 + 3y_3|y_3|^2 + 6y_3|y_1|^2 + 6y_3|y_2|^2)$ |
| FOURTH HARMONIC | $\frac{\alpha_2}{2^2}(2y_1 y_3 + y_2^2) + \frac{\alpha_3}{2^3}(3y_1^2 y_2 + 6y_1^* y_2 y_3 + 3y_2^* y_3^2)$ |
| FIFTH HARMONIC | $\frac{\alpha_2}{2^2} 2y_2 y_3 + \frac{\alpha_3}{2^3}(3y_1^2 y_3 + 3y_1 y_2^2 + 3y_1^* y_3^2)$ |
| SIXTH HARMONIC | $\frac{\alpha_2}{2^2} y_3^2 + \frac{\alpha_3}{2^3}(6y_1 y_2 y_3 + y_2^3)$ |
| SEVENTH HARMONIC | $\frac{\alpha_3}{2^3}(3y_1 y_3^2 + 3y_2^2 y_3)$ |
| EIGHTH HARMONIC | $\frac{\alpha_3}{2^3} y_2 y_3^2$ |
| NINTH HARMONIC | $\frac{\alpha_3}{2^3} y_3^3$ |

FIG. 4

DIGITAL PRE-DISTORTION DEVICE AND METHOD FOR A BROADBAND POWER AMPLIFIER

TECHNICAL FIELD

The present invention relates, in general, to a digital pre-distortion device and method and, more particularly, to a digital predistortion device and method for a broadband power amplifier, which are operated in a dynamic spectrum allocation system that utilizes a broadband frequency range, as in the case of a Cognitive Radio (CR) system.

BACKGROUND ART

With an exponential increase in communication demands such as mobile communication, television (TV) broadcasting, a local area network, or a metropolitan area network, limited frequency resources have almost reached a saturation state. Therefore, technologies for efficiently distributing and utilizing limited frequency resources have recently attracted attention.

Among these technologies, research into Cognitive Radio (CR) has been actively conducted, which can recognize the current condition of use of frequency bands that are continuously changed, select an available frequency band, and utilize the available frequency band without interfering with a conventional radio environment, thus maximizing the frequency usage rate.

CR is a scheme for searching a spectrum of a very wide frequency range, utilizing a currently usable frequency band, controlling a carrier frequency and bandwidth, and transmitting signals, rather than a scheme for transmitting signals using a fixed carrier frequency as in the case of a conventional communication scheme. That is, a CR system is characterized in that, after a very wide band has been searched, transmission can be performed using any frequency band.

In the conventional communication system, the transmission bandwidth (BW) of signals is generally much smaller than a carrier frequency $f_c$ ($f_c \gg BW$). Therefore, harmonic signals occurring at integer multiples of $f_c$ ($2f_c$, $3f_c$, $4f_c$, ...) due to the nonlinear characteristics of a power amplifier are undesirable signals, and can be easily eliminated by a filter at the output terminal of the amplifier.

However, as described above, the CR system must take into consideration a wide band compared to the conventional communication system, and a carrier frequency and bandwidth must be freely changed in the corresponding band, so that the transmission bandwidth to be considered is much greater than the carrier frequency ($f_c \ll BW$). Therefore, the output filter of the amplifier has a wideband pass function without causing only a specific frequency to pass therethrough. Consequently, a transmittable frequency band ranges over a wide band, so that harmonic signals generated by the amplifier may fall within the corresponding communication band, thus making it difficult to eliminate the harmonic signals at the output terminal of the amplifier. That is, since the frequency of harmonic signals may be used to transfer transmission signals as occasion demands, a specific frequency filter cannot be installed. Further, in the CR system, the carrier frequency of signals desired to be transmitted is dynamically changed, so that harmonic signals are also dynamically changed, thus making it difficult to eliminate harmonic signals caused by nonlinear output signals by using a filter or the like.

When these harmonic signals are not eliminated, they influence the conventional communication system, such as by acting as interference to the conventional communication system, in a system borrowing any available spectrum, as in the case of the CR system, and thus the harmonic signals must be eliminated.

DISCLOSURE

Technical Problem

Accordingly, the present invention has been made keeping in mind the above problems occurring in the prior art, and an object of the present invention is to provide a digital predistortion device and method, which are operated in a dynamic spectrum allocation system that utilizes a wide band frequency range, as in the case of a CR system.

Another object of the present invention is to provide a digital predistortion device and method, which can simultaneously linearize a fundamental signal at the location of a frequency $f_c$ and eliminate harmonic signals generated at the locations of high frequencies of $2f_c$, $3f_c$, $4f_c$, ..., whereas a conventional predistortion device is intended to merely linearize a signal in a fundamental frequency band.

Technical Solution

A digital predistortion device according to a preferred embodiment of the present invention includes a nonlinear power amplifier for amplifying N input signals generated by a random signal generator, and then generating N output signals; an equivalent amplifier model estimator for receiving the N input signals and the N output signals, and estimating characteristics of the nonlinear power amplifier; a coefficient extractor for extracting coefficients of N predistorters using the estimated characteristics of the nonlinear power amplifier; and N predistorters for eliminating or compensating for all or part of the N output signals.

Further, the N predistorters may include N-1 harmonic elimination predistorters for eliminating second to Nth harmonic signals from the N output signals of the nonlinear power amplifier; and a fundamental signal predistorter for compensating for nonlinear characteristics of a fundamental signal among the N output signals of the nonlinear power amplifier.

A digital predistortion device according to another preferred embodiment of the present invention may further include Digital to Analog Converters (DACs) for converting the N input signals into analog signals; first mixers for upconverting the N signals converted into analog signals; real operators for selecting real number signals from among the upconverted signals; second mixers for downconverting the N output signals of the nonlinear power amplifier; Analog to Digital Converters (ADCs) for converting the downconverted signals into digital signals; and low pass filters for eliminating image signals from the signals converted into the digital signals.

Further, the coefficient extractor may be configured to first extract a coefficient of a harmonic elimination predistorter corresponding to a harmonic of a highest frequency among the N-1 harmonic elimination predistorters, and then extract coefficients of harmonic elimination predistorters corresponding to harmonics of lower frequencies by stages.

Furthermore, the coefficient extractor may be configured to extract and fix all coefficients of the harmonic elimination predistorters, and thereafter extract a coefficient of the fundamental signal predistorter.

In detail, a digital predistortion method according to a preferred embodiment of the present invention includes (a) a random signal generator generating N input signals; (b) a nonlinear power amplifier amplifying the generated N input signals, and then generating N output signals; (c) an equivalent amplifier model estimator receiving the N input signals and the N output signals, and estimating characteristics of the nonlinear power amplifier; (d) a coefficient extractor extracting coefficients for N-1 harmonic elimination predistorters and a single fundamental signal predistorter using the estimated characteristics of the nonlinear power amplifier; (e) the N-1 harmonic elimination predistorters eliminating second or higher harmonic signals from the N output signals; and (f) the fundamental signal predistorter compensating for nonlinear characteristics occurring in a fundamental signal among the N output signals.

Further, the digital predistortion method may further include, between (a) and (b), (a-1) Digital to Analog Converters (DACs) converting the N input signals into analog signals; (a-2) first mixers upconverting the signals converted into the analog signals; (a-3) real operators selecting real number signals from among the upconverted signals; and (a-4) inputting the real number signals selected at (a-3) to the nonlinear power amplifier.

Furthermore, the digital predistortion method may further include, between (b) and (c), (b-1) inputting the N output signals of the nonlinear power amplifier to second mixers and downconverting the N output signals; (b-2) Analog to Digital Converters (ADCs) converting the downconverted signals into digital signals; and (b-3) low pass filters eliminating imagine signals from the signals converted into the digital signals.

In detail, (d) may include first extracting a coefficient of a harmonic elimination predistorter corresponding to a harmonic of a highest frequency among the N-1 harmonic elimination predistorters, and then extracting coefficients of harmonic elimination predistorters corresponding to harmonics of lower frequencies by stages; and extracting and fixing all coefficients of the N-1 harmonic elimination predistorters, and thereafter extracting a coefficient of the fundamental signal predistorter.

Advantageous Effects

In accordance with a digital predistortion device and method of the present invention, there can be provided a digital predistortion device and method which are operated in a dynamic spectrum allocation system that utilizes a wide band frequency range, as in the case of a CR system.

Further, a conventional predistortion device has the effect of merely linearizing only a signal in a fundamental frequency band, whereas the present invention can implement a digital predistortion device and method which simultaneously linearize a fundamental signal at the location of a frequency f and eliminate harmonic signals generated at the locations of high frequencies of $2f_c$, $3f_c$, $4f_c$, . . . .

DESCRIPTION OF DRAWINGS

FIG. 4 illustrates intermodulation terms when K=3;

Figure 1:
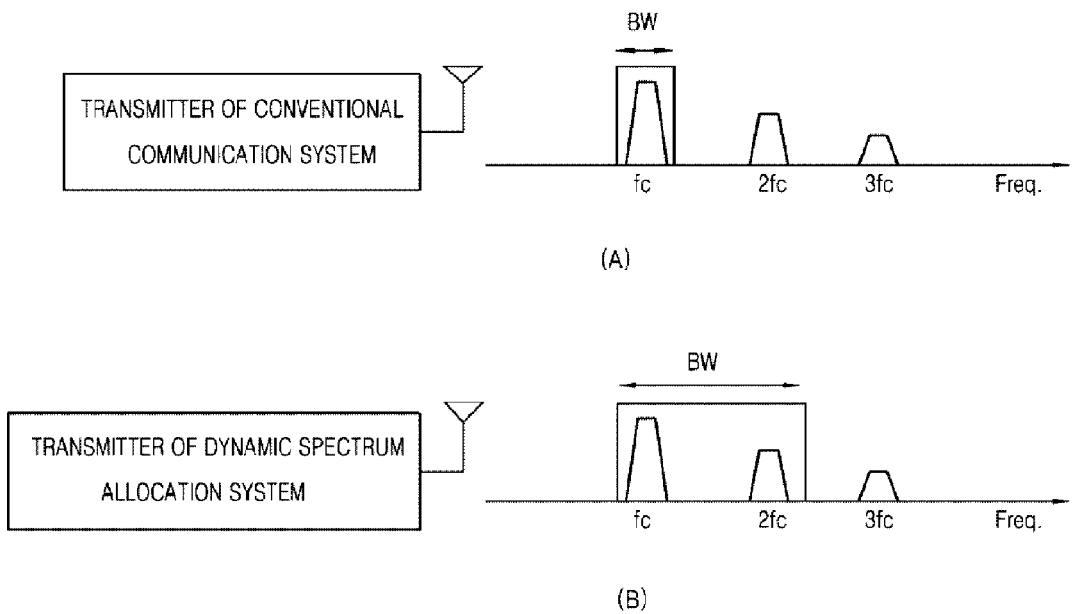
FIG. 1 is a diagram showing a comparison between a conventional communication system and a Cognitive Radio (CR) system.

| Description of reference characters of principal parts | |
|---|---|
| 10: nonlinear power amplifier | |
| 20: equivalent amplifier model estimator | |
| 30: coefficient extractor | |
| 40: predistorter | 50: DAC |
| 60: first mixer | 70: real operator |
| 80: second mixer | 90: ADC |
| 100: low pass filter | |

BEST MODE

Hereinafter, a digital predistortion device and method for a broadband power amplifier according to embodiments of the present invention will be described in detail with reference to the attached drawings.

It is apparent that the following embodiments of the present invention are merely intended to embody the present invention and are not intended to restrict or limit the scope of the present invention. Contents that can be easily inferred by those skilled in the art from the detailed description and embodiments of the present invention are interpreted as being included in the scope of the present invention.

First, a comparison between a conventional communication system and a Cognitive Radio (CR) system is shown in FIG. 1.

As can be seen from FIG. 1(A), the transmission bandwidth (BW) of signals in the conventional communication system is generally much smaller than a carrier frequency $f_c$ ($f_c$>>BW). Therefore, harmonic signals generated at integer multiples of $f_c$ ($2f_c$, $3f_c$, $4f_c$, . . . , ) due to the nonlinear characteristics of the power amplifier are undesirable signals and can be easily eliminated by a filter at the output terminal of the amplifier.

However, as can be seen from FIG. 1(B), in a dynamic spectrum allocation system that utilizes a wide band frequency range, as in the case of the CR system, a band that is wider than that of the conventional communication system must be taken into consideration, and a carrier frequency and bandwidth must be able to be freely changed within the corresponding band, so that the transmission bandwidth to be considered is much greater than the carrier frequency ($f_c \ll BW$). Therefore, the output filter of the amplifier has a wide band-pass function without causing only a specific frequency to pass therethrough. Consequently, a transmittable frequency band ranges over a wide band, so that harmonic signals generated in the amplifier may fall within the corresponding communication band, thus making it difficult to eliminate the harmonic signals at the output terminal of the amplifier.

Therefore, an object of a conventional predistortion transmitter is to linearize only a signal in a fundamental frequency band, whereas the present invention needs to simultaneously linearize a fundamental signal at the location of a frequency $f_c$ and eliminate harmonic signals generated at the locations of high frequencies of $2f_c, 3f_c, 4f_c, \ldots$.

Below, differences between the predistortion devices and methods of the conventional communication system and the dynamic spectrum allocation system, such as the CR system, will be described in detail.

Conventional Communication System

Figure 2:
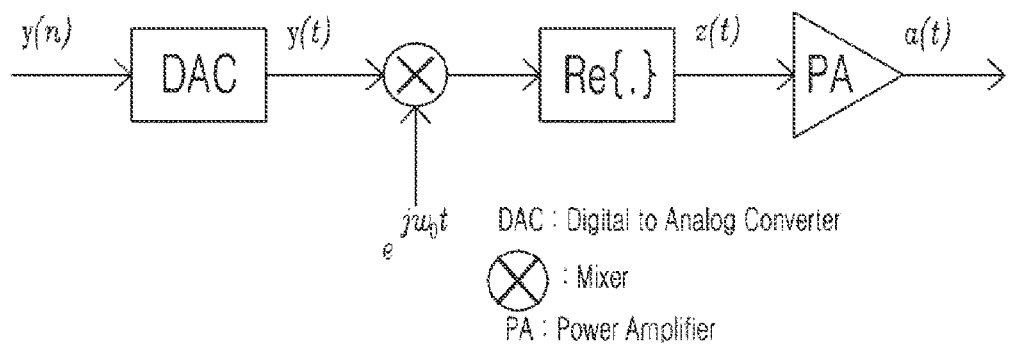
FIG. 2 illustrates a diagram showing the pass band transmitter model of the conventional communication system.

In FIG. 2, the pass band transmitter model of the conventional communication system is shown.

A complex signal y(n) is converted into an analog signal y(t) by a Digital to Analog Converter (DAC), and y(t) is upconverted by a mixer and is then converted into a real number signal z(t). After z(t) has been amplified by a nonlinear power amplifier, it is transmitted, wherein a nonlinear power amplifier $G_p(\ )$ is represented by a Kth-degree polynomial, as given in the following Equation 1:

$$a(t) = \sum_{k}^{K} \alpha_k z^k(t) \quad \text{Equation 1}$$

where $\{\alpha_k\}$ denotes a coefficient indicating the characteristics of the nonlinear power amplifier. In order to consider the influence of the nonlinear characteristics of the nonlinear power amplifier, a relational expression of a passband and a baseband, given in the following Equation 2, is used:

$$z(t) = \text{Re}\{y(t)e^{j\omega_0 t}\} = \frac{1}{2}[y(t)e^{j\omega_0 t} + y^t(t)e^{-j\omega_0 t}] \quad \text{Equation 2}$$

where $\omega_0 = 2\pi f_c$, and $f_c$ denotes a carrier frequency. When Equation 2 is applied to Equation 1, an equation such as Equation 3 can be obtained:

$$a(t) = a_0(t) + [e^{j\omega_0 t} a_1(t) + e^{-j\omega_0 t} a_1^*(t)] + [e^{j2\omega_0 t} a_2(t) + \quad \text{Equation 3}$$
$$e^{-j2\omega_0 t} a_2^*(t)] + [e^{j3\omega_0 t} a_3(t) + e^{-j3\omega_0 t} a_3^*(t)] + \ldots$$

where $$a_0(t) = \sum_{k} \alpha_k \frac{\binom{2k}{k}}{2^{2k}} |y(t)|^{2k},$$

$$a_1(t) = \sum_{k} \alpha_k \frac{\binom{2k+1}{k}}{2^{2k+1}} |y(t)|^{2k} y(t),$$

$$a_2(t) = \sum_{k} \alpha_k \frac{\binom{2k}{k+1}}{2^{2k}} |y(t)|^{2k} y(t)^2,$$

$$a_3(t) = \sum_{k} \alpha_k \frac{\binom{2k+1}{k+1}}{2^{2k+1}} |y(t)|^{2k} y(t)^3, \ldots,$$

and $a_0(t)$ denotes an output signal at a Direct Current (DC) location, $a_1(t)$ denotes a fundamental signal that is the first harmonic signal of a transmission signal, $a_2(t)$ denotes the second harmonic signal of the transmission signal, and $a_3(t)$ denotes the third harmonic signal of the transmission signal. The conventional predistortion technique considered only the linearization of the fundamental signal $a_1(t)$, and did not consider second or higher harmonic signals generated due to nonlinear characteristics. However, in the dynamic spectrum allocation system, such as the CR system, second or higher harmonic signals must be eliminated. Therefore, the present invention presents a predistortion algorithm which considers both the elimination of second or higher harmonic signals and the linearization of the fundamental signal.

Dynamic Spectrum Allocation System

Figure 3:
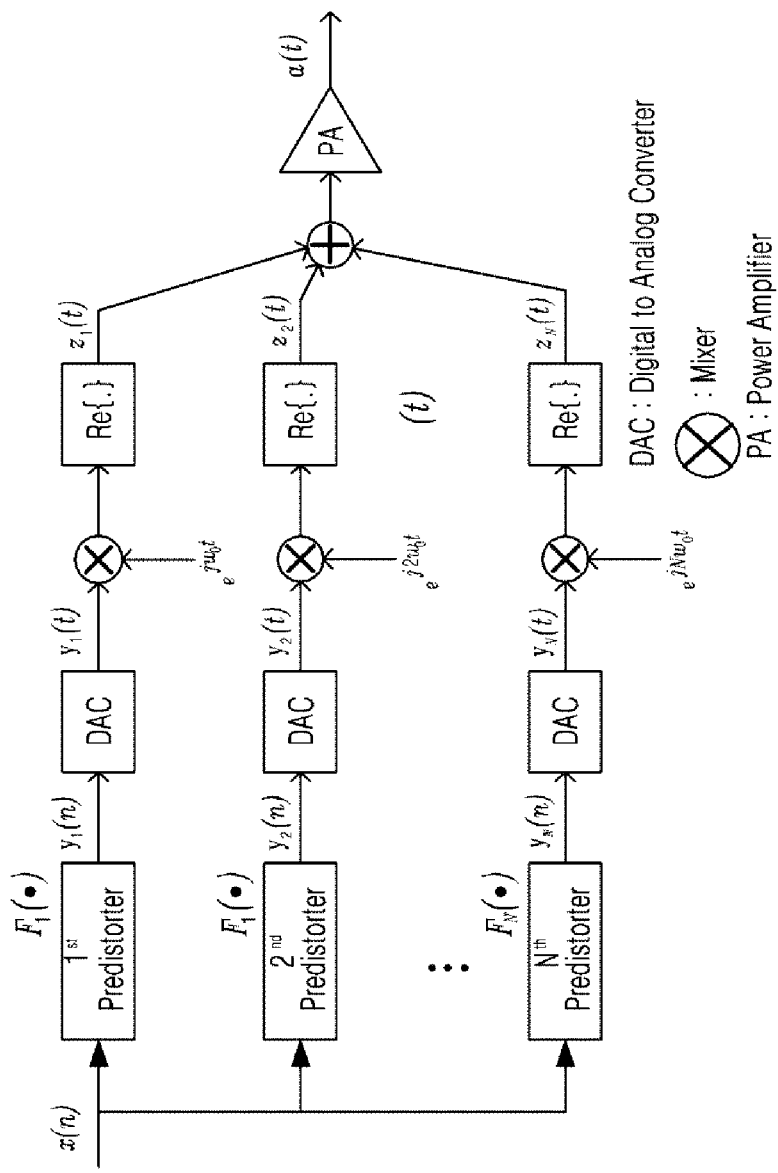
FIG. 3 illustrates an embodiment of a predistortion device for eliminating harmonic signals generated due to the nonlinear characteristics of a nonlinear power amplifier.

FIG. 3 illustrates an embodiment of a typical predistortion device capable of eliminating harmonic components generated at the output of a nonlinear power amplifier.

Predistorters are located at respective locations corresponding to integer multiples of a carrier frequency in a baseband, $F_1(\ )$ denotes a fundamental signal predistorter for linearizing a fundamental signal, and $F_2(\ ), F_3(\ ), \ldots$ respectively denote harmonic elimination predistorters for eliminating second, third, and higher harmonic signals.

The output signal of a multi-input transmitter, as shown in FIG. 3 has a very complicated form due to the nonlinear characteristics of the amplifier. A description will be made based on an embodiment when N=3. When it is assumed that $y_1(t), y_2(t)$, and $y_3(t)$ are respective inputs of the nonlinear power amplifier, if $z_1(t)=\text{Re}\{y_1(t)e^{j\omega_0 t}\}$, $z_2(t)=\text{Re}\{y_2(t)e^{j2\omega_0 t}\}$, $z_3(t)=\text{Re}\{y_3(t)e^{j3\omega_0 t}\}$, and $z(t)=z_1(t)+z_2(t)+z_3(t)$ are applied to Equation 1, the following Equation 4 can be obtained:

$$a(t) = a_0(t) + [e^{j\omega_0 t} a_1(t) + e^{-j\omega_0 t} a_1^*(t)] + [e^{j2\omega_0 t} a_2(t) + \quad \text{Equation 4}$$
$$e^{-j2\omega_0 t} a_2^*(t)] + [e^{j3\omega_0 t} a_3(t) + e^{-j3\omega_0 t} a_3^*(t)] + \ldots$$

where $$a_0(t) = G_0(y_1(t), y_2(t), y_3(t))$$
$$= \frac{\alpha_2}{2^2}(2|y_1|^2 + 2|y_2|^2 + 2|y_3|^2) + \ldots$$

$$a_1(t) = G_1(y_1(t), y_2(t), y_3(t))$$
$$= \frac{\alpha_1}{2} y_1 + \frac{\alpha_2}{2^2}(2y_1^* y_2 + 2y_2^* y_3) + \ldots$$

$$a_2(t) = G_2(y_1(t), y_2(t), y_3(t)) = \frac{\alpha_1}{2} y_2 + \frac{\alpha_2}{2^2}(y_1^2 + 2y_1^* y_3) + \ldots$$

$$a_3(t) = G_3(y_1(t), y_2(t), y_3(t)) = \frac{\alpha_1}{2} y_3 + \frac{\alpha_2}{2^2} 2 y_1 y_2 + \ldots$$

A time index t is omitted for simple expression, and $G_i(,,)$ denotes a nonlinear function of the nonlinear power amplifier. All intermodulation terms are arranged in terms of K=3 in FIG. 4.

If relational expressions $y_1(n)=F_1(x(n))$, $y_2(n)=F_2(x(n))$, and $y_2(n)=F_3(x(n))$ are applied while the above Equation 4 is newly represented in a discrete domain, the following Equation 5 can be obtained:

$$a(n) = a_0(n) + [e^{j\omega_0 n}a_1(n) + e^{-j\omega_0 n}a_1^*(n)] +$$
$$[e^{j2\omega_0 n}a_2(n) + e^{-j2\omega_0 n}a_2^*(n)] +$$
$$[e^{j3\omega_0 n}a_3(n) + e^{-j3\omega_0 n}a_3^*(n)] + \ldots$$

Equation 5 where $$a_0(n) = G_0(F_1(x), F_2(x), F_3(x(n)))$$
$$= G_0(y_1(n), y_2(n), y_3(n))$$
$$= \frac{\alpha_2}{2^2}(2|y_1|^2 + 2|y_2|^2 + 2|y_3|^2) + \ldots$$

$$a_1(n) = G_1(F_1(x), F_2(x), F_3(x(n)))$$
$$= G_1(y_1(n), y_2(n), y_3(n))$$
$$= \frac{\alpha_1}{2}y_1 + \frac{\alpha_2}{2^2}(2y_1^*y_2 + 2y_2^*y_3) + \ldots$$

$$a_2(n) = G_2(F_1(x), F_2(x), F_3(x(n)))$$
$$= G_2(y_1(n), y_2(n), y_3(n))$$
$$= \frac{\alpha_1}{2}y_2 + \frac{\alpha_2}{2^2}(y_1^2 + 2y_1^*y_3) + \ldots$$

$$a_3(n) = G_3(F_1(x), F_2(x), F_3(x(n)))$$
$$= G_3(y_1(n), y_2(n), y_3(n))$$
$$= \frac{\alpha_1}{2}y_3 + \frac{\alpha_2}{2^2}2y_1y_2 + \ldots$$

A time index n is omitted for simple representation.

In an embodiment of the present invention, the problem of designing predistorters from the output equation when N=3 is summarized by obtaining $F_1(\ )$ $F_2(\ )$ and $F_3(\ )$ that simultaneously satisfy the following Equation 6:

$$a_1(n) = G_1(F_1(x(n)), F_2(x(n)), F_3(x(x(n)))) = x(n)$$

$$a_2(n) = G_2(F_1(x(n)), F_2(x(n)), F_3(x(n))) = 0$$

$$a_3(n) = G_3(F_1(x(n)), F_2(x(n)), F_3(x(n))) = 0 \quad \text{Equation 6}$$

However, in Equation 6, $G_i(,,)$ is a nonlinear function, so that it is not easy to directly and simultaneously solve individual items of Equation 6.

Figure 5:
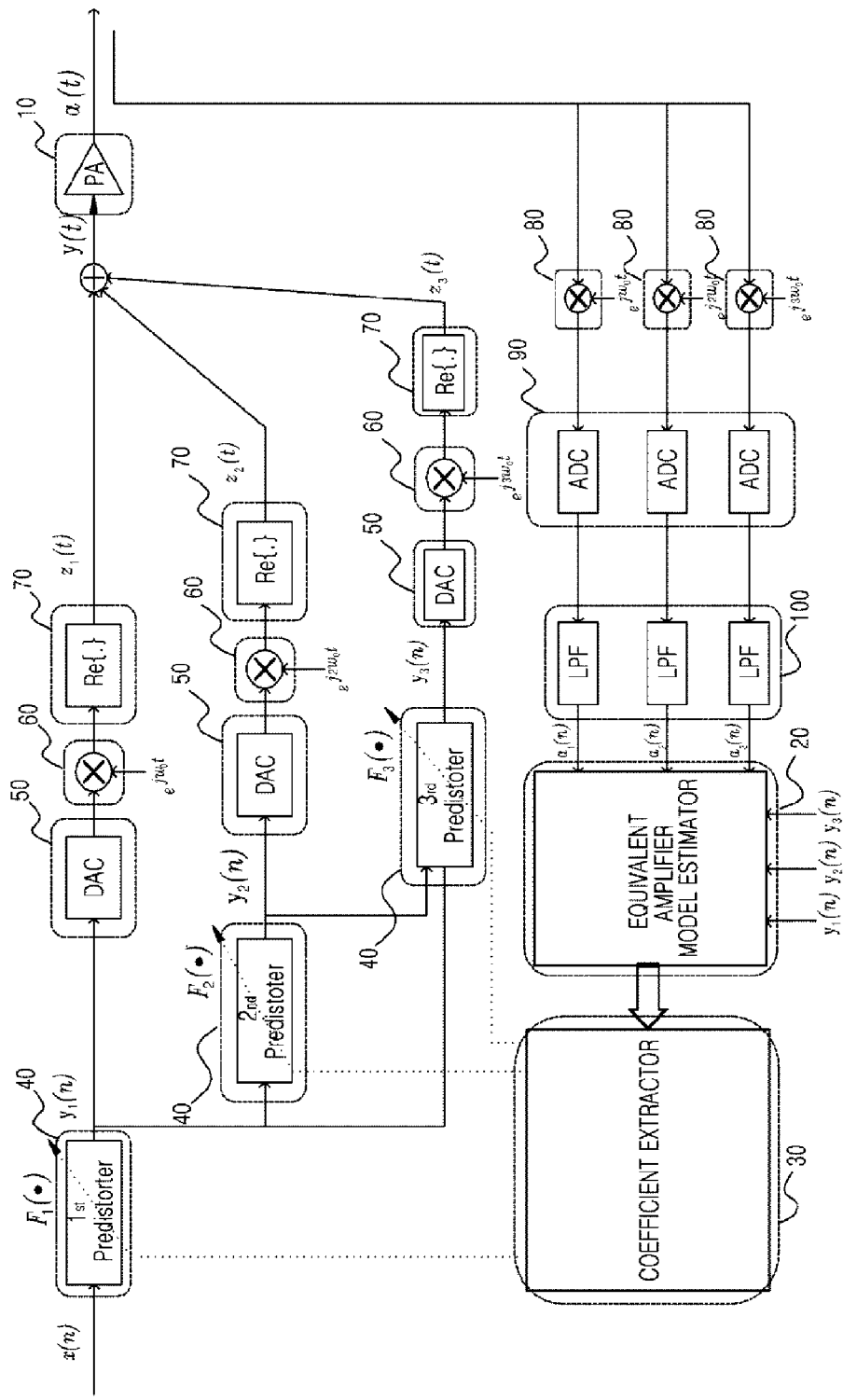
FIG. 5 is a configuration diagram showing a predistortion device according to a preferred embodiment of the present invention.

Therefore, the configuration of a predistortion device according to a preferred embodiment of the present invention shown in FIG. 5 is proposed. However, in FIG. 5, the case of N=3 is exemplified, but it is apparent that N is a random number and is extensible.

As shown in FIG. 5, a digital predistortion device according to a preferred embodiment of the present invention includes a random signal generator (not shown); a nonlinear power amplifier (PA) 10; an equivalent amplifier model estimator 20; a coefficient extractor 30; and N predistorters 40.

The functions of the above components according to the present invention will be described below.

The nonlinear power amplifier 10 functions to receive N input signals generated by the random signal generator, amplify the N input signals, and generate N output signals. The nonlinear power amplifier 10 of the present invention is a concept including even the model of a power amplifier, as well as a power amplifier as an actual element.

The equivalent amplifier model estimator 20 functions to receive the N input signals and the N output signals of the nonlinear power amplifier 10, and estimate the baseband characteristics of the nonlinear power amplifier 10.

Further, when the N input signals and the N output signals for the equivalent amplifier model estimator 20 are not signals in the baseband, the procedure of respectively converting the input signals and the output signals into N input signals and N output signals in the baseband may be added to the inside or the outside of the equivalent amplifier model estimator 20.

Furthermore, the coefficient extractor 30 extracts coefficients for the pre-distorters 40 using the estimated characteristics of the nonlinear power amplifier 10.

The predistorters 40 may include harmonic elimination predistorters and a fundamental signal predistorter.

N-1 harmonic elimination predistorters function to eliminate second to Nth harmonic signals from the N output signals of the nonlinear power amplifier 10, and the fundamental signal predistorter functions to compensate for the nonlinear characteristics of the fundamental signal among the N output signals of the nonlinear power amplifier 10.

That is, the digital predistortion device according to an embodiment of the present invention can implement an adaptive coefficient algorithm by including the equivalent amplifier model estimator 20 and the coefficient extractor 30, unlike the typical predistortion device of FIG. 3.

The digital predistortion device of the present invention may further include Digital to Analog Converters (DACs) 50 for converting the N input signals for the nonlinear power amplifier 10 into analog signals; first mixers 60 for upconverting the N signals converted into the analog signals; real operators 70 for selecting only real number signals from among the upconverted signals; second mixers 80 for downconverting the output signals of the nonlinear power amplifier 10; Analog to Digital Converters (ADCs) 90 for converting the downconverted signals from analog signals into digital signals; and Low Pass Filters (LPFs) 100 for eliminating image signals generated during the procedure of performing conversion into the digital signals.

In the present invention according to the embodiment of FIG. 5, Equation 6 can be changed to the following Equation 7:

$$a_1(n) = G_1(F_1(x(n)), F_2(F_1(x(n))), F_3(F_2(F_1(x(n))))) = x(n)$$

$$a_2(n) = G_2(y_1(n), F_2(y_1(n)), F_3(F_2(y_1(n)))) = 0$$

$$a_3(n) = G_3(y_1(n), y_2(n), F_3(y_2(n))) = 0 \quad \text{Equation 7}$$

In a new structure, for random input $y_1(n)$ and $y_2(n)$ in the last expression of Equation 7, $F_3(\ )$ can be obtained first. Thereafter, in the second expression, $F_3(\ )$ is fixed, and then $F_2(\ )$ can be obtained. Finally, after $F_2(\ )$ and $F_3(\ )$ have been fixed, $F_1(\ )$ can be obtained in the first expression. Therefore, harmonic signals can be eliminated by stages, and the N predistorters 40 for linearizing the fundamental signal can be designed. Further, even for higher harmonic signals, predistorters can be extended by stages in the same manner.

Below, a detailed embodiment of the present invention when N=3 will be described in detail.

Estimation of Equivalent Power Amplifier Model

In a first stage, the equivalent amplifier model estimator 20 estimates an equivalent amplifier model at the locations of harmonic frequencies in the baseband of the nonlinear power amplifier 10. When the equivalent amplifier model of the fundamental signal is arranged based on Equation 4 and FIG. 4, the following Equation 8 can be obtained:

$$a_1(n) = w_{11}y_1 + w_{12}y_1^*y_2 + w_{13}y_2^*y_3 + w_{14}y_1|y_1|^2 +$$
$$w_{15}y_2^2 y_3^* + w_{16}y_1^{*2}y_3 + w_{17}y_1|y_2|^2 + w_{18}y_1|y_3|^2$$
$$= w_1(n)^T u_1(n)$$

Equation 8 where $$w_1 = [w_{11}, w_{12}, w_{13}, w_{14}, w_{15}, w_{16}, w_{17}, w_{18}]^T,$$

and $$u_1(n) =$$
$$[y_1(n), y_1^*(n)y_2(n), y_2^*(n)y_3(n), y_1(n)|y_1(n)|^2, y_2^2(n)y_3^*(n), y_1^{*2}(n)y_3(n), y_1(n)|y_2(n)|^2, y_1(n)|y_3(n)|^2]^T.$$

Each element of $u_1(n)$ is a combination of $y_1(n)$, $y_2(n)$, and $y_3(n)$ that make the output of the term $e^{j\omega_0 n}$ in the output of the nonlinear power amplifier 10. In this case, the number of the above coefficients varies according to the nonlinear order K of the nonlinear power amplifier 10. For example, when K=3, the output has nonlinear terms ranging to a third order. Similarly, the equivalent nonlinear power amplifier models of second and third harmonic signals can be represented by the following Equations 9 and 10, respectively:

$$a_2(n) = w_{21}y_2 + w_{22}y_1^2 + w_{23}y_1^*y_3 + w_{24}y_2|y_2|^2 +$$
$$w_{25}y_2|y_1|^2 + w_{26}y_2|y_3|^2 + w_{27}y_1y_2^*y_3$$
$$= w_2(n)^T u_2(n)$$

Equation 9 where $$w_2 = [w_{21}, w_{22}, w_{23}, w_{24}, w_{25}, w_{26}, w_{27}]^T,$$

and $$u_2(n) = [y_2(n), y_1(n)^2, y_1(n)^*y_3(n), y_2(n)|y_1(n)|^2, y_2(n)|y_2(n)|^2, y_2(n)|y_3(n)|^2, y_1(n)y_2^*(n)y_3(n)]^T.$$

$$a_3(n) = w_{31}y_3 + w_{32}y_1y_2 + w_{33}y_1^3 + w_{34}y_1^*y_2^2 +$$
$$w_{35}y_3|y_3|^2 + w_{36}y_3|y_1|^2 + w_{37}y_3|y_2|^2$$
$$= w_3(n)^T u_3(n)$$

Equation 10 where $$w_3 = [w_{31}, w_{32}, w_{33}, w_{34}, w_{35}, w_{36}, w_{37}]^T,$$

and $$u_3(n) = [y_3(n), y_1(n)y_2(n), y_1(n)^3, y_1^*(n)y_2(n)^2, y_3(n)|y_1(n)|^2, y_3(n)|y_2(n)|^2, y_3(n)|y_3(n)|^2]^T.$$

In the above Equations 8, 9, and 10, the examples of the nonlinear power amplifier model were limited to third-degree polynomials. However, to improve performance, the degree of a polynomial can be extended by a system designer.

In Equations 9 and 10, individual elements of $u_2(n)$ and $u_3(n)$ are combinations of $y_1(n)$, $y_2(n)$, and $y_3(n)$ that make the output of terms $e^{j2\omega_0 n}$ and $e^{j3\omega_0 n}$ in the output of the nonlinear power amplifier 10. Cost functions required to obtain $w_1$, $w_2$, and $w_3$ indicating the characteristics of the nonlinear power amplifier 10 are defined by Equation 11:

$$\varepsilon_{w_1} = E\{|e_{w_1}(n)|^2\}, \varepsilon_{w_2} = E\{|e_{w_2}(n)|^2\}, \varepsilon_{w_3} = E\{|e_{w_3}(n)|^2\}$$

Equation 11 where $e_{w_1}(n) = a_1(n) - \hat{w}_1^T(n)u_1(i)$ $e_{w_2}(n) = a_2(n) - \hat{w}_2^T(n)u_2(n)$, $e_{w_3}(n) = a_3(n) - \hat{w}_3^T(n)u_3(n)$, and $\hat{w}_1(n)$, $\hat{w}_2(n)$, and $\hat{w}_3(n)$ denote the estimation vectors of $w_1$, $w_2$, and $w_3$. In order to derive a Least Mean Squares (LMS) algorithm, Equation 11 can be changed to the form of Equation 12.

$$\varepsilon_{w_1} = |e_{w_1}(n)|^2, \varepsilon_{w_2} = |e_{w_2}(n)|^2, \varepsilon_{w_3} = |e_{w_3}(n)|^2$$

Equation 12

Updated equations of $\hat{w}_1(n)$, $\hat{w}_2(n)$, and $\hat{w}_3(n)$ for minimizing Equation 12 are derived by the following Equation 13:

$$\hat{w}_1(n+1) = \hat{w}_1(n) - \frac{1}{2}\mu_1 \frac{\partial \varepsilon_{w_1}(n)}{\partial w_1(n)}$$
$$= \hat{w}_1(n) + \mu_1 e_{w_1}^*(n) u_1(n),$$

Equation 13

-continued $$\hat{w}_2(n+1) = \hat{w}_2(n) - \frac{1}{2}\mu_2 \frac{\partial \varepsilon_{w_2}(n)}{\partial w_2(n)}$$
$$= \hat{w}_2(n) + \mu_2 e_{w_2}^*(n) u_2(n),$$

$$\hat{w}_3(n+1) = \hat{w}_3(n) - \frac{1}{2}\mu_3 \frac{\partial \varepsilon_{w_3}(n)}{\partial w_3(n)}$$
$$= \hat{w}_3(n) + \mu_3 e_{w_3}^*(n) u_3(n)$$

where each of $\mu_1$, $\mu_2$, and $\mu_3$ denotes a step size required to control convergence speed and stability.

Extraction of Coefficients of Harmonic Elimination Predistorters

After the equivalent amplifier models have been estimated, coefficients of the predistorters 40 for eliminating harmonics and linearizing a fundamental signal can be extracted. First, after a third harmonic signal has been eliminated based on an amplifier model for the third harmonic signal, a second harmonic signal is eliminated. The third predistorter for eliminating the third harmonic signal can be represented by the following Equation 14:

$$y_3(n) = p_3^T v_3(n) \qquad \text{Equation 14}$$

where $p_3 = [p_{31}, p_{32}, p_{33}, p_{34}, p_{35}, p_{36}, p_{37}, \ldots]^T$ $v_3(n) = [y_1(n)y_2(n), y_1(n)^3, y_1^*(n)y_2(n)^2, y_1(n)^3|y_1(n)|^2, y_1(n)^3|y_2(n)|^2, y_1^*(n)y_2(n)^2|y_1(n)|^2, y_1^*(n)y_2(n)^2|y_2(n)|^2, \ldots]^T$ and the degree of the polynomial of the predistorter can be determined by a designer.

Each element of $v_3(n)$ is implemented as a combination of $y_1(n)$ and $y_2(n)$ that make $e^{j3\omega_0 n}$ in the output of the nonlinear power amplifier 10. A cost function required to obtain the optimal coefficient of the third predistorter is defined by the following Equation 15:

$$\epsilon_{p_3} = |e_{p_3}(n)|^2 \qquad \text{Equation 15}$$

where $e_{p_3}(n) = 0 - \hat{w}_3^T u_3(n)$. That is, this is intended to minimize an output signal at the location of $3f_c$. An adaptive coefficient algorithm for minimizing $\epsilon_{p_3}$ is derived by the following Equation 16:

$$\hat{p}_3(n+1) = \hat{p}_3(n) - \frac{1}{2}\mu_{p_3} \frac{\partial \epsilon_{p_3}(n)}{\partial p_3(n)}$$

$$= \hat{p}_3(n) - \frac{1}{2}\mu_{p_3} \frac{\partial y_3(n)}{\partial p_3(n)} \frac{\partial |e_{p_3}(n)|^2}{\partial y_3(n)} \qquad \text{Equation 16}$$

where $\mu_{p_3}$ denotes a step size.

Using the same manner, the coefficient update algorithm of a second predistorter for eliminating a second harmonic signal can be obtained. The second predistorter can be represented by the following Equation 17:

$$y_2(n) = p_2^T v_2(n) \qquad \text{Equation 17}$$

where $p_2 = [p_{21}, p_{22}, p_{23}, p_{24}, \ldots]^T$ and $v_2(n) = [y_1(n)^2, y_1(n)^2|y_1(n)|^2, y_1(n)^2|y_1(n)|^4, y_1(n)^2|y_1(n)|^6, \ldots]^T$.

Each element of $v_2(n)$ is implemented as a combination of $y_1(n)$ that makes $e^{j2\omega_0 n}$ in the output of the amplifier, and the degree of a polynomial can be determined by the designer. A cost function required to obtain the optimal coefficient of the second predistorter is defined by the following Equation 18:

$$\epsilon_{p_2} = |e_{p_2}(n)|^2 \qquad \text{Equation 18}$$

where $e_{p_2}(n) = 0 - \hat{w}_2^T u_2(n)$. That is, this is intended to minimize the output signal at the location of $2f_c$. An adaptive coefficient algorithm for minimizing $\epsilon_{p_2}$ is derived by the following Equation 19:

$$\hat{p}_2(n+1) = \hat{p}_2(n) - \frac{1}{2}\mu_{p_2} \frac{\partial \epsilon_{p_2}(n)}{\partial p_2(n)}$$

$$= \hat{p}_2(n) - \frac{1}{2}\mu_{p_2} \frac{\partial y_2(n)}{\partial p_2(n)} \frac{\partial |e_{p_2}(n)|^2}{\partial y_2(n)}$$

$$= \hat{p}_2(n) - \frac{1}{2}\mu_{p_2} \left[ \frac{\partial y_2(n)}{\partial p_2(n)} \frac{\partial |e_{p_2}(n)|^2}{\partial y_2(n)} + \frac{\partial y_3(n)}{\partial p_2(n)} \frac{\partial |e_{p_2}(n)|^2}{\partial y_3(n)} \right]$$

$$= \hat{p}_2(n) - \frac{1}{2}\mu_{p_2} \left[ \frac{\partial y_2(n)}{\partial p_2(n)} \frac{\partial |e_{p_2}(n)|^2}{\partial y_2(n)} + \frac{\partial y_2(n)}{\partial p_2(n)} \frac{\partial y_3(n)}{\partial p_2(n)} \frac{\partial |e_{p_2}(n)|^2}{\partial y_3(n)} \right] \qquad \text{Equation 19}$$

where $\mu_{p_2}$ denotes a step size.

After the third predistorter and the second predistorter for eliminating harmonics have been designed through the above process, the coefficient of the first predistorter for linearizing the fundamental signal can be extracted.

Extraction of Coefficient of Predistorter for Linearizing Fundamental Signal

After the coefficients of the third predistorter and the second predistorter that were extracted above have been fixed, the coefficient of a fundamental signal predistorter that is a first predistorter is finally extracted. The fundamental signal is implemented as an odd-order component, so that the first predistorter is represented by the following Equation 20:

$$y_1(n) = p_1^T v_1(n) \qquad \text{Equation 20}$$

where $p_1 = [p_{11}, p_{12}, p_{13}, p_{14}, \ldots]^T$, $v_2(n) = [x(n), x(n)|x(n)x(n)|^2, x(n)|x(n)|^4, x(n)|x(n)|^6, \ldots]^T$, and the degree of the polynomial of the predistorter can be determined by the designer.

A cost function required to obtain the coefficient of the first predistorter is defined by the following Equation 21:

$$\epsilon_{p_1} = |e_{p_1}(n)|^2 \qquad \text{Equation 21}$$

where $e_{p_1}(n) = x(n) - \hat{w}_1^T u_1(n)$. An adaptive coefficient algorithm for minimizing $E_{p_1}$ is derived by the following Equation 22:

$$\hat{p}_1(n+1) = \hat{p}_1(n) - \frac{1}{2}\mu_{p_1} \frac{\partial \epsilon_{p_1}(n)}{\partial p_1(n)}$$

$$= \hat{p}_1(n) - \frac{1}{2}\mu_{p_1} \left[ \frac{\partial y_1(n)}{\partial p_1(n)} \frac{\partial |e_{p_1}(n)|^2}{\partial y_1(n)} + \frac{\partial y_2(n)}{\partial p_1(n)} \frac{\partial |e_{p_1}(n)|^2}{\partial y_2(n)} + \frac{\partial y_3(n)}{\partial p_1(n)} \frac{\partial |e_{p_1}(n)|^2}{\partial y_3(n)} \right] \qquad \text{Equation 22}$$

-continued $$= \hat{p}_1(n) - \frac{1}{2}\mu_{p_1}\left[\frac{\partial y_1(n)}{\partial p_1(n)}\frac{\partial |e_{p_1}(n)|^2}{\partial y_1(n)} + \frac{\partial y_1(n)}{\partial p_1(n)}\frac{\partial y_2(n)}{\partial p_1(n)}\frac{\partial |e_{p_1}(n)|^2}{\partial y_2(n)} + \frac{\partial y_1(n)}{\partial p_1(n)}\frac{\partial y_2(n)}{\partial y_1(n)}\frac{\partial y_3(n)}{\partial y_1(n)}\frac{\partial |e_{p_1}(n)|^2}{\partial y_3(n)}\right]$$

where $\mu_{p_1}$ denotes a step size. After the harmonic elimination predistorters have been designed through the above process, the coefficient of the fundamental signal predistorter that is the first predistorter for linearizing the fundamental signal can be estimated.

Figure 6:
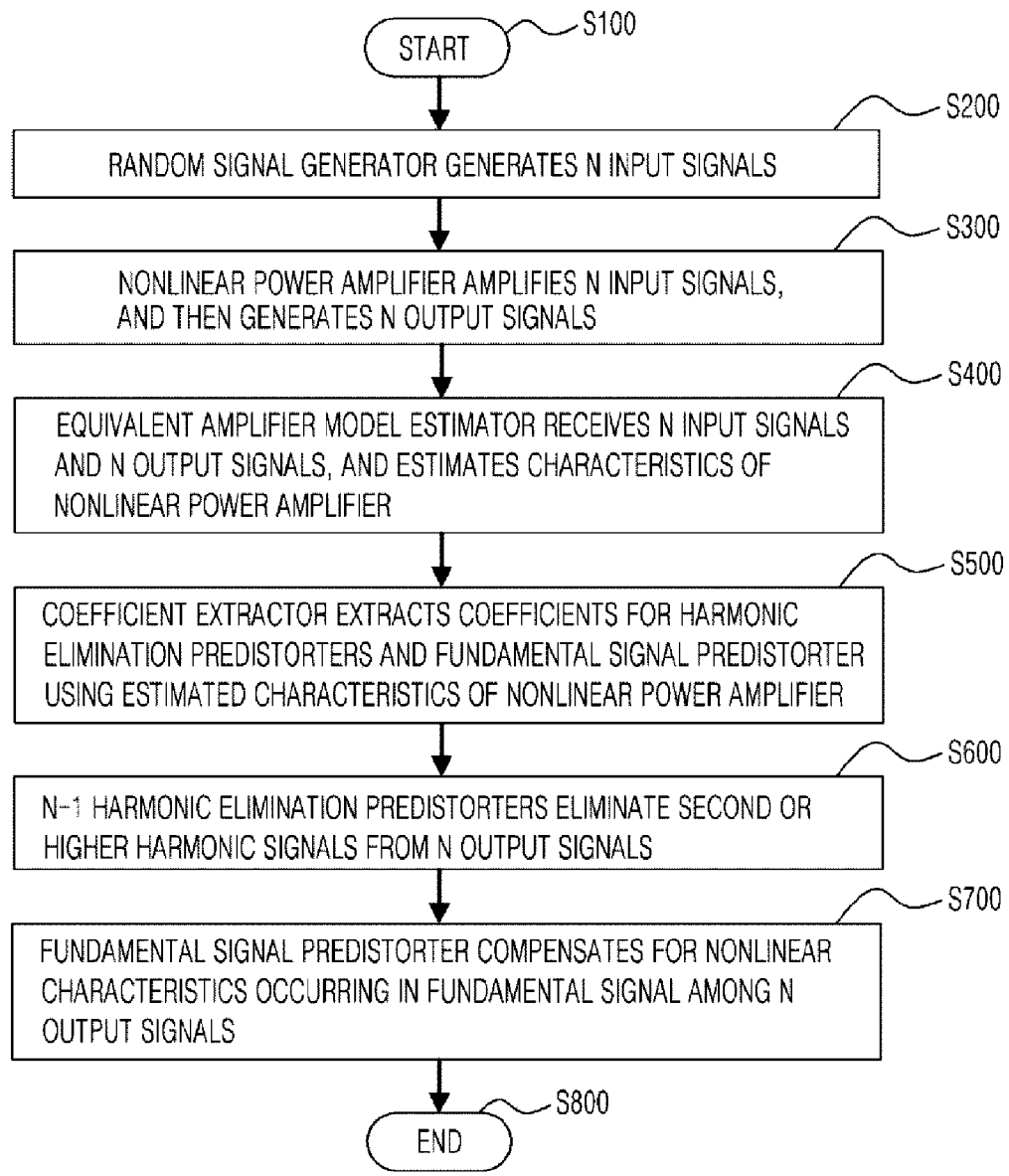
FIG. 6 is a flowchart showing a digital predistortion method according to a preferred embodiment of the resent invention.

The digital predistortion method according to the embodiment of the present invention can be summarized as shown in FIG. 6.

That is, the digital predistortion method according to the present invention includes the step S200 of the random signal generator generating N input signals; the step S300 of the nonlinear power amplifier 10 amplifying the generated N input signals and then generating N output signals; the step S400 of the equivalent amplifier model estimator 20 receiving the N input signals and the N output signals, and estimating the characteristics of the nonlinear power amplifier 10; the step S500 of the coefficient extractor 30 extracting coefficients for harmonic elimination predistorters and a fundamental signal predistorter using the estimated characteristics of the nonlinear power amplifier; the step S600 of N-1 harmonic elimination predistorters eliminating second or higher harmonic signals from the N output signals; and the step S700 of the fundamental signal predistorter compensating for nonlinear characteristics occurring in the fundamental signal among the N output signals.

Figure 7:
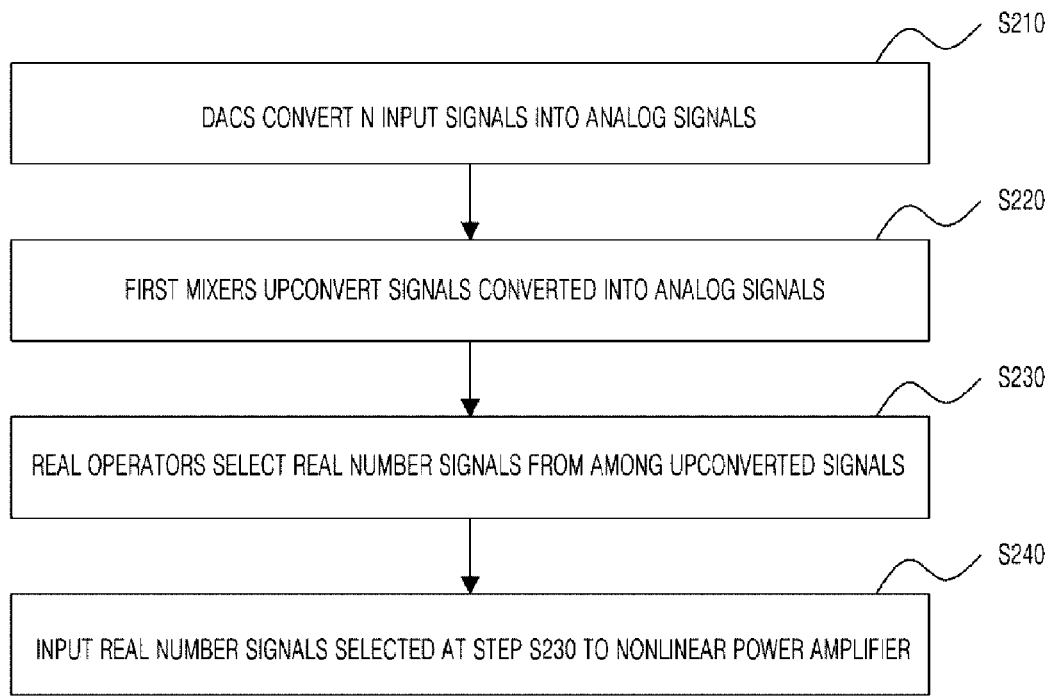
FIG. 7 is a diagram showing the procedure of preprocessing input signals to be input to a nonlinear power amplifier.

Further, FIG. 7 illustrates the procedure for preprocessing input signals to be input to the nonlinear power amplifier 10.

As shown in FIG. 7, the digital predistortion method according to the present invention may further include, between step S200 and step S300, the step S210 of the DACs 50 converting the N input signals into analog signals; the step S220 of the first mixers 60 upconverting the signals converted into the analog signals; the step S230 of the real operators 70 selecting real number signals from among the upconverted signals; and the step S240 of inputting the real number signals selected at step S230 to the nonlinear power amplifier 10.

Figure 8:
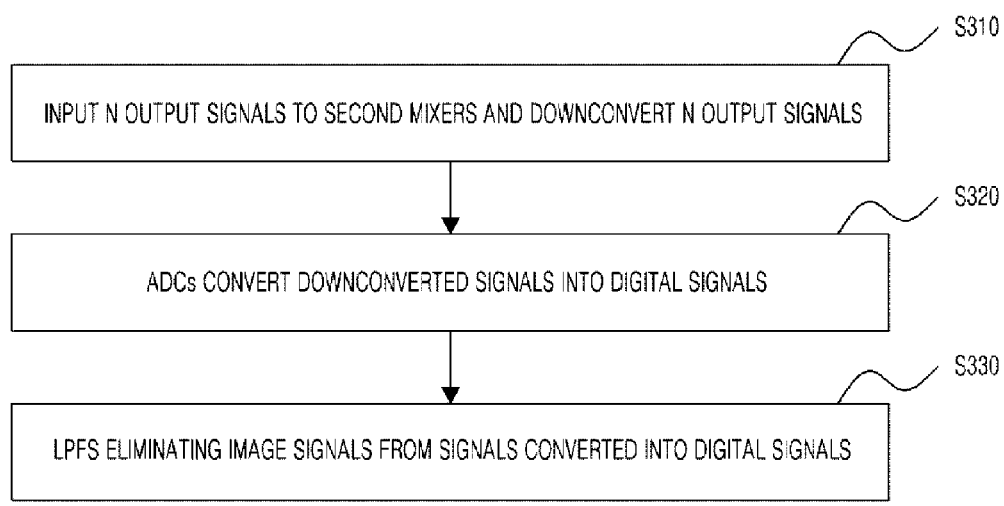
FIG. 8 is a flowchart showing signals to be input to an equivalent amplifier model estimator.

FIG. 8 is a flowchart showing the processing of signals to be input to the equivalent amplifier model estimator 20.

That is, the digital predistortion method according to the present invention includes the step S310 of inputting the N output signals of the nonlinear power amplifier 10 to the second mixers 80 and downconverting the N output signals; the step S320 of the ADCs 90 converting the downconverted signals into digital signals; and the step S330 of the low pass filters 100 eliminating image signals from imaginary numbers of the signals converted into the digital signals, in order to process the signals to be input to the equivalent amplifier model estimator 20.

Figure 9:
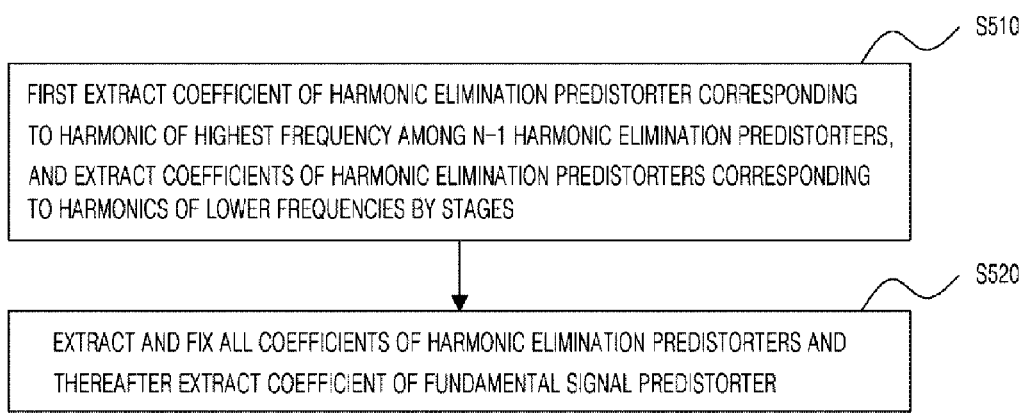
FIG. 9 is a flowchart showing the extraction of coefficients by a coefficient extractor.

A detailed flowchart showing the detailed coefficient extraction step S500 performed by the coefficient extractor 30 is illustrated in FIG. 9. As shown in FIG. 9, the coefficient extraction step may include the step S510 of first extracting the coefficient of a harmonic elimination predistorter corresponding to a harmonic of the highest frequency among the N-1 harmonic elimination predistorters, and extracting the coefficients of harmonic elimination predistorters corresponding to harmonics of lower frequencies by stages; and the step S520 of extracting and fixing all the coefficients of the harmonic elimination predistorters and thereafter extracting the coefficient of the fundamental signal predistorter.

Verification of Effects

Figure 10:
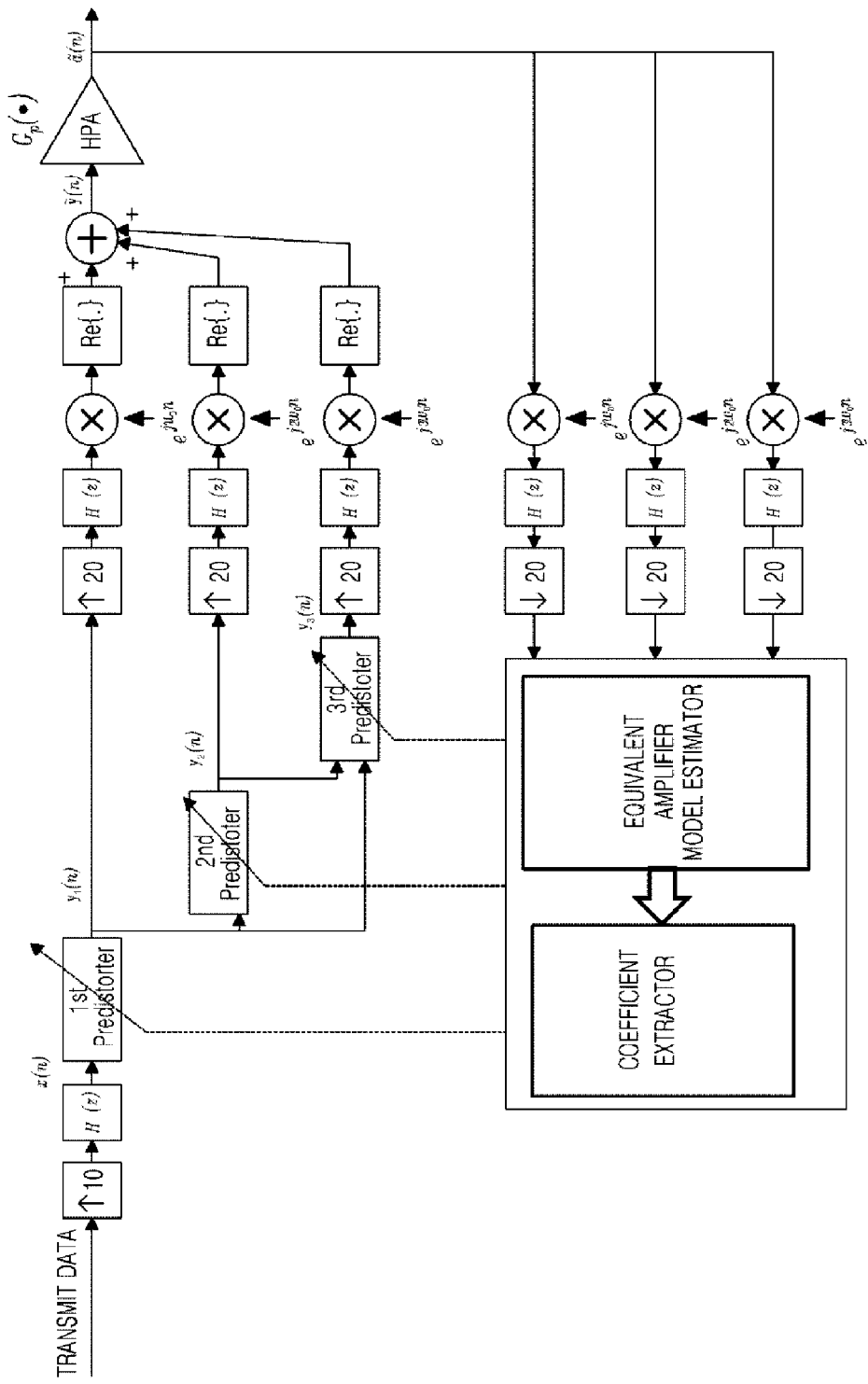
FIG. 10 illustrates a simulation environment for verifying the effect of the present invention.

In order to verify the effects of the present invention, computer simulation was conducted. The environment of the simulation is shown in FIG. 10. As a transmission signal x(n) for a transmitter, a signal obtained by filtering a 16-Quadrature Amplitude Modulated (QAM) signal using a Square Root Raised Cosine (SRRC) filter having a roll-off value of 0.25 and a 10-times oversampled value was used. In order to verify the output of the amplifier in a passband, a 10-times oversampled signal is processed via predistorter blocks, the processed signal is 20-times upsampled, the upsampled signal is upconverted by a mixer, and the upconverted signal is input to a passband power amplifier. In a feedback path, in order to estimate an equivalent amplifier model and the coefficients of predistorters, frequency signals $f_c$, $2f_c$, and $3f_c$ are downconverted and filtered, and resulting signals are 20-times downsampled. The nonlinear power amplifier used in the simulation can be represented by the following Equation 23:

$$a(n)=y(n)-0.8y(n)^2+0.7y(n)^3 \qquad \text{Equation 23}$$

Figure 11:
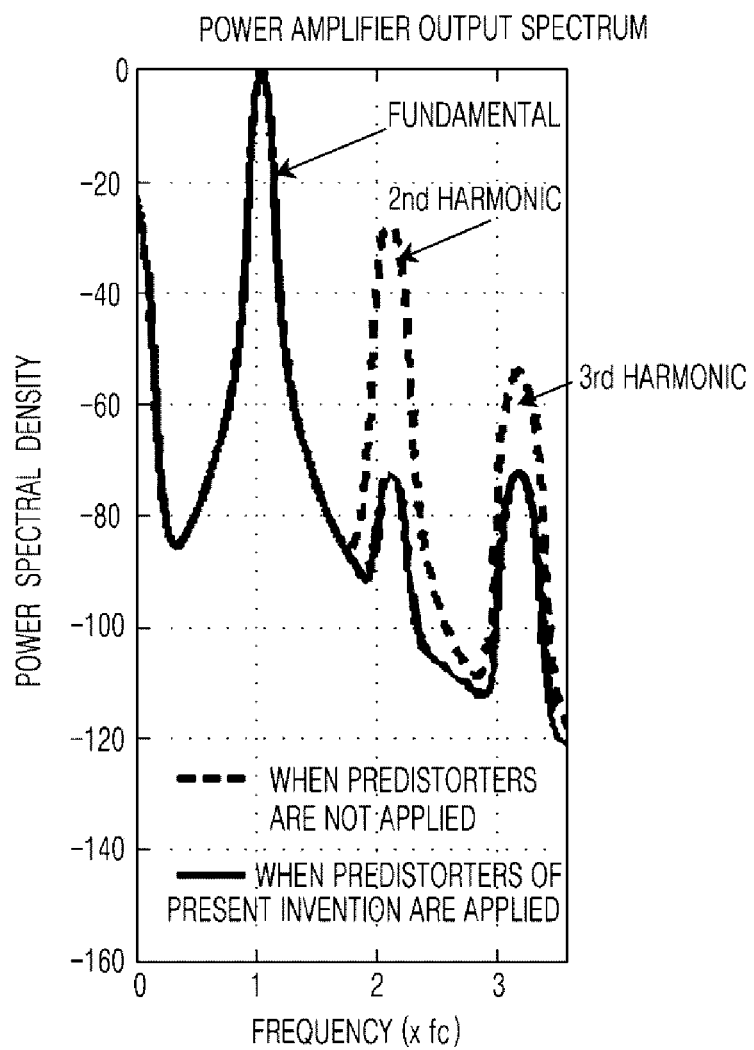
FIG. 11 illustrates the performance of harmonic elimination according to an embodiment of the present invention.

FIG. 11 illustrates harmonic elimination performance when the predistortion scheme proposed in the present invention was applied.

As can be seen from FIG. 11, when predistorters are not applied, a fundamental signal is output at the location of a frequency $f_c$, and harmonic signals are generated at the locations of $2f_c$ and $3f_c$ to cause undesirable interference signals. In order to eliminate such harmonic signals, when the predistortion scheme proposed in the present invention is applied, it can be seen that the harmonic signals can be reduced by about 40 dB at the location of $2f_c$ and by about 20 dB at the location of $3f_c$.

Figure 12:
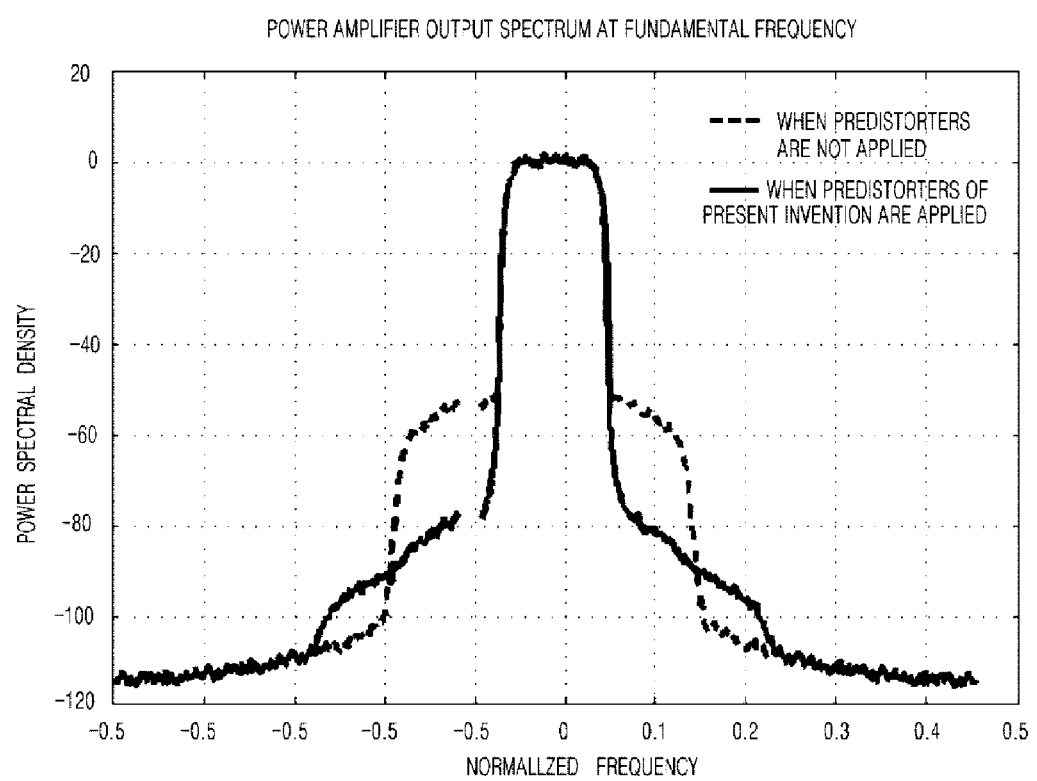
FIG. 12 illustrates the frequency spectrum of a fundamental signal according to an embodiment of the present invention.
Figure 13:
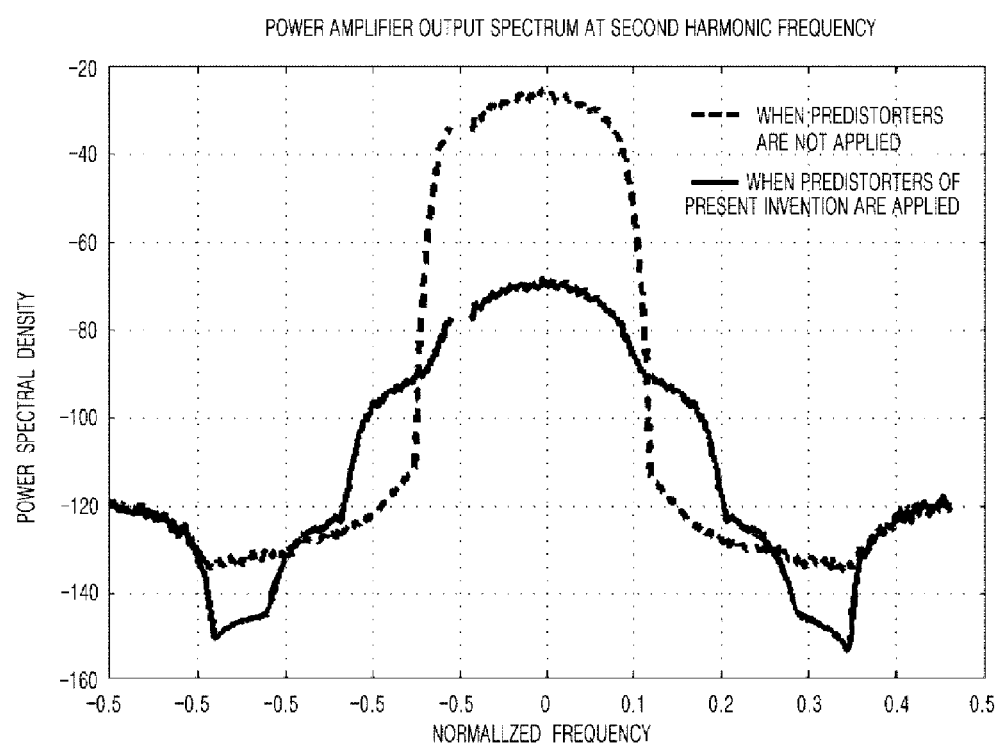
FIG. 13 is a diagram showing the frequency spectrum of a second harmonic signal according to an embodiment of the present invention.
Figure 14:
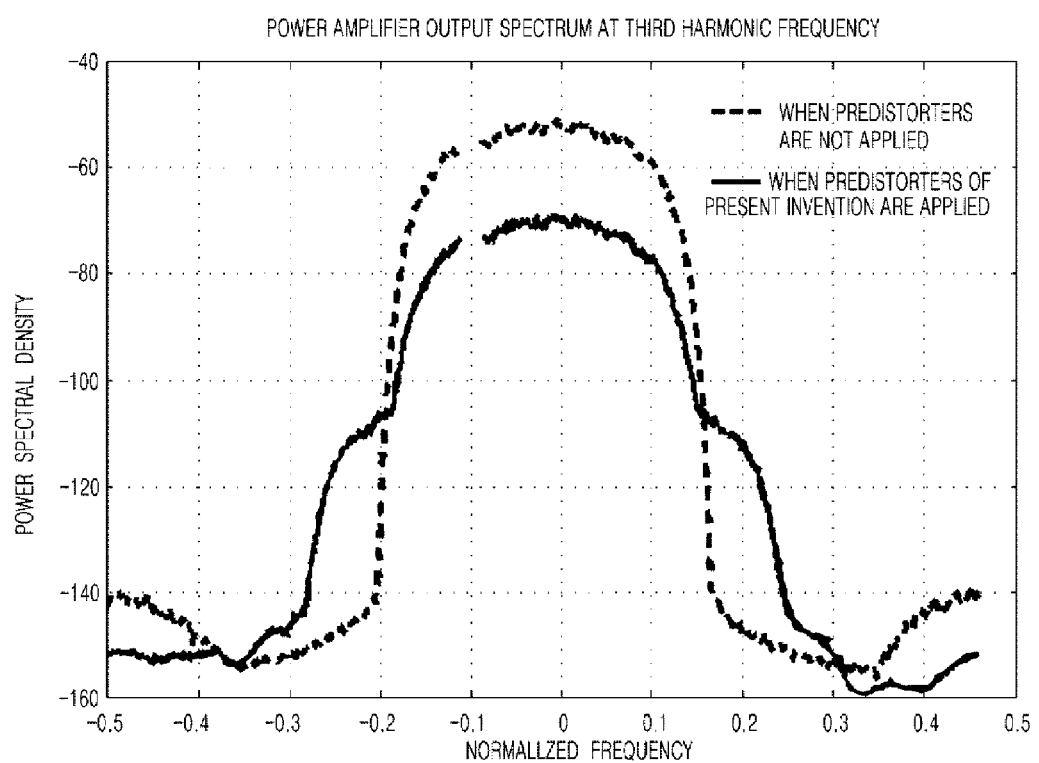
FIG. 14 is a diagram showing the frequency spectrum of a third harmonic signal according to an embodiment of the present invention.

FIGS. 12, 13, and 14 illustrate frequency spectra obtained by converting signals at respective frequency locations into baseband signals, and viewed at the respective frequency locations. It can be seen that by means of linearization based on the predistortion scheme proposed in FIG. 8, interference could be reduced in a band adjacent to the fundamental signal by about 20 dB or more. In FIGS. 13 and 14, the attenuation of harmonic signals caused by nonlinearity can be verified. It can be seen that in FIG. 13, a second harmonic signal was reduced by about 40 dB, and in FIG. 14, a third harmonic signal was reduced by about 20 dB.

From the above description, it can be seen that second or higher harmonic signals can be effectively eliminated while a fundamental signal can also be linearized, by using the new predistortion scheme proposed in the present invention. The present invention is determined to be usefully applied to a CR system, and can be used to eliminate harmonics even in conventional systems.

Mode for Invention

What is claimed is:

1. A digital predistortion device for broadband power amplifier, comprising:
   Digital to Analog Converters (DACs) for converting N input signals generated by a random signal generator into analog signals;
   first mixers for upconverting the N input signals converted by the DACs;

real operators for selecting real number signals from the N input signals upconverted by the first mixer;

a nonlinear power amplifier for amplifying N input signals and then generating N output signals;

second mixers for downconverting the N output signals of the nonlinear power amplifier;

Analog to Digital Converters (ADCs) for converting the N output signals downconverted by the second mixers into digital signals;

low pass filters for eliminating image signals from the N output signals converted by the ADCs;

an equivalent amplifier model estimator for receiving the N input signals and the N output signals, and estimating characteristics of the nonlinear power amplifier;

N predistorters for eliminating or compensating for all or part of the N output signals; and a coefficient extractor for extracting coefficients of the N predistorters using the characteristics of the nonlinear power amplifier estimated by the equivalent amplifier model estimator.

2. The digital predistortion device of claim 1, wherein the N predistorters comprise:

N-1 harmonic elimination predistorters for eliminating second to Nth harmonic signals from the N output signals of the nonlinear power amplifier; and a fundamental signal predistorter for compensating for nonlinear characteristics of a fundamental signal among the N output signals of the nonlinear power amplifier.

3. The digital predistortion device of claim 1, wherein the characteristics of the nonlinear power amplifier estimated by the equivalent amplifier model estimator for the fundamental signal can be represented by the following Equation:

$$a_1(n) = w_{11} y_1 + w_{12} y_1^* y_2 + w_{13} y_2^* y_3 + w_{14} y_1 |y_1|^2 +$$
$$w_{15} y_2^2 y_3^* + w_{16} y_1^{*2} y_3 + w_{17} y_1 |y_2|^2 + w_{18} y_1 |y_3|^2$$
$$= w_1(n)^T u_1(n)$$

where $$w_1 = [w_{11}, w_{12}, w_{13}, w_{14}, w_{15}, w_{16}, w_{17}, w_{18}]^T,$$

and $$u_1(n) = [y_1(n), y_1^*(n)y_2(n), y_2^*(n)y_3(n), y_1(n)|y_1(n)|^2, y_2^2(n)y_3^*(n), y_1^{*2}(n)y_3(n), y_1(n)|y_2(n)|^2, y_1(n)|y_3(n)|^2]^T$$

(where $W_1$ denotes a coefficient indicating the characteristics of the nonlinear power amplifier, $Y_1(n), Y_2(n), \ldots$ denote the N input signals of the nonlinear power amplifier, $Y^*_1(n), Y^*_2(n), \ldots$ denote complex conjugates of the N input signals, wherein an example of a nonlinear power amplifier model is limited to third-degree polynomials, but a degree of a polynomial can be extended by a system designer to improve performance).

4. The digital predistortion device of claim 1, wherein the characteristics of the nonlinear power amplifier estimated by the equivalent amplifier model estimator for second and third harmonic signals can be represented by the following Equations (5-1) and (5-2), respectively:

$$a_2(n) = w_{21} y_2 + w_{22} y_1^2 + w_{23} y_1^* y_3 + w_{24} y_2 |y_2|^2 + \tag{5-1}$$
$$w_{25} y_2 |y_1|^2 + w_{26} y_2 |y_3|^2 + w_{27} y_1 y_2^* y_3$$
$$= w_2(n)^T u_2(n)$$

where
$$w_2 = [w_{21}, w_{22}, w_{23}, w_{24}, w_{25}, w_{26}, w_{27}]^T,$$
and
$$u_2(n) = [y_2(n), y_1(n)^2, y_1(n)^* y_3(n), y_2(n)|y_1(n)|^2, y_2(n)|y_2(n)|^2, y_2(n)|y_3(n)|^2, y_1(n)y_2^*(n)y_3(n)]^T,$$

$$a_3(n) = w_{31} y_3 + w_{32} y_1 y_2 + w_{33} y_1^3 + w_{34} y_1^* y_2^2 + \tag{5-2}$$
$$w_{35} y_3 |y_3|^2 + w_{36} y_3 |y_1|^2 + w_{37} y_3 |y_2|^2$$
$$= w_3(n)^T u_3(n)$$

where
$$w_3 = [w_{31}, w_{32}, w_{33}, w_{34}, w_{35}, w_{36}, w_{37}]^T,$$
and
$$u_3(n) = [y_3(n), y_1(n)y_2(n), y_1(n)^3, y_1^*(n)y_2(n)^2, y_3(n)|y_1(n)|^2, y_3(n)|y_2(n)|^2, y_3(n)|y_3(n)|^2]^T$$

(where $W_2$ and $W_3$ denote coefficients indicating the characteristics of the nonlinear power amplifier, $Y_1(n), Y_2(n), \ldots$ denote the N input signals of the nonlinear power amplifier, and $Y^*_1(n), Y^*_2(n), \ldots$ denote complex conjugates of the N input signals, wherein an example of a nonlinear power amplifier model is limited to third-degree polynomials, but a degree of a polynomial can be extended by a system designer to improve performance).

5. The digital predistortion device of claim 3, wherein cost functions for $W_1$, $W_2$, and $W_3$ indicating the characteristics of the nonlinear power amplifier are represented by the following Equation:

$$\epsilon_{w_1}=E\{|e_{w_1}(n)|^2\}, \epsilon_{w_2}=E\{|e_{w_2}(n)|^2\}, \epsilon_{w_3}=E\{|e_{w_3}(n)|^2\}$$

(where $e_{w_1}(n)=a_1(n)-\hat{w}_1^T(n)u_1(i), e_{w_2}(n)=a_2(n)-\hat{w}_2^T(n)u_2(n)$, $e_{w_3}(n)=a_3(n)-\hat{w}_3^T(n)u_3(n)$, and $\hat{w}_1(n)$, $\hat{w}_2(n)$, and $\hat{w}_3(n)$ denote estimation vectors of $W_1$, $W_2$, and $W_3$, respectively).

6. The digital predistortion device of claim 3, wherein cost functions for $W_1$, $W_2$, and $W_3$ indicating the characteristics of the nonlinear power amplifier are represented by the following Equation to derive a Least Mean Squares (LMS) algorithm:

$$\epsilon_{w_1}=|e_{w_1}(n)|^2, \epsilon_{w_2}=|e_{w_2}(n)|^2, \epsilon_{w_3}=|e_{w_3}(n)|^2$$

(where $e_{w_1}(n)=a_1(n)-\hat{w}_1^T(n)u_1(i), e_{w_2}(n)=a_2(n)-\hat{w}_2^T(n)u_2(n)$, $e_{w_3}(n)=a_3(n)-\hat{w}_3^T(n)u_3(n)$, and $\hat{w}_1(n)$, $\hat{w}_2(n)$, and $\hat{w}_3(n)$ denote estimation vectors of $W_1$, $W_2$, and $W_3$, respectively).

7. The digital predistortion device of claim 6, wherein updated equations of $W_1(n)$, $W_2(n)$, and $W_3(n)$ for minimizing the cost functions are represented by the following Equations:

$$\hat{w}_1(n+1) = \hat{w}_1(n) - \frac{1}{2}\mu_1 \frac{\partial \varepsilon_{w_1}(n)}{\partial w_1(n)}$$
$$= \hat{w}_1(n) + \mu_1 e^*_{w_1}(n)u_1(n),$$

$$\hat{w}_2(n+1) = \hat{w}_2(n) - \frac{1}{2}\mu_2 \frac{\partial \varepsilon_{w_2}(n)}{\partial w_2(n)}$$
$$= \hat{w}_2(n) + \mu_2 e^*_{w_2}(n)u_2(n),$$

$$\hat{w}_3(n+1) = \hat{w}_3(n) - \frac{1}{2}\mu_3 \frac{\partial \varepsilon_{w_3}(n)}{\partial w_3(n)}$$
$$= \hat{w}_3(n) + \mu_3 e^*_{w_3}(n)u_3(n)$$

(where each of $\mu_1$, $\mu_2$, and $\mu_3$, denotes a step size required to control convergence speed and stability).

8. The digital predistortion device of claim 2, wherein the coefficient extractor is configured to first extract a coefficient of a harmonic elimination predistorter corresponding to a harmonic of a highest frequency among the N-1 harmonic elimination predistorters, and then extract coefficients of harmonic elimination predistorters corresponding to harmonics of lower frequencies by stages.

9. The digital predistortion device of claim 2, wherein the coefficient extractor is configured to extract and fix all coefficients of the harmonic elimination predistorters, and thereafter extract a coefficient of the fundamental signal predistorter.

10. The digital predistortion device of claim 8, wherein a harmonic elimination predistorter for eliminating a third harmonic signal, a cost function for obtaining a coefficient of the harmonic elimination predistorter, and an adaptive coefficient algorithm for minimizing the cost function are respectively represented by the following Equations (11-1), (11-2), and (11-3) when N=3, $$y_3(n)=p_3^T v_3(n) \quad (11\text{-}1)$$

where $p_3=[p_{31}, p_{32}, p_{33}, p_{34}, p_{35}, p_{36}, p_{37}, \ldots]^T$, $v_3(n)=[y_1(n)y_2(n), y_1(n)^3, y_1^*(n)y_2(n)^2, y_1(n)^3|y_1(n)|^2,$
$y_1(n)^3|y_2(n)|^2, y_1^*(n)y_2(n)^2|y_1(n)|^2, y_1^*(n)y_2(n)^2|y_2(n)|^2, \ldots]^T$, and $y_1(n)$ and $y_2(n)$ denote first and second input signals of the nonlinear power amplifier, wherein a degree of a polynomial of the predistorter can be determined by a designer), $$\epsilon_{p_3}=|e_{p_3}(n)|^2 \quad (11\text{-}2)$$

(where $e_{p_3}(n)=0-\hat{w}_3^T(n)u_3(n)$), and $$\hat{p}_3(n+1) = \hat{p}_3(n) - \frac{1}{2}\mu_{p_3} \frac{\partial \varepsilon_{p_3}(n)}{\partial p_3(n)} \quad (11\text{-}3)$$
$$= \hat{p}_3(n) - \frac{1}{2}\mu_{p_3} \frac{\partial y_3(n)}{\partial p_3(n)} \frac{\partial |e_{p_3}(n)|^2}{\partial y_3(n)}$$

(where $\mu_{p_3}$, denotes a step size).

11. The digital predistortion device of claim 8, wherein a harmonic elimination predistorter for eliminating a second harmonic signal, a cost function for obtaining a coefficient of the harmonic elimination predistorter, and an adaptive coefficient algorithm for minimizing the cost function are respectively represented by the following Equations (12-1), (12-2), and (12-3) when N=3, $$y_2(n)=p_2^T v_2(n) \quad (12\text{-}1)$$

(where $p_2=[p_{21}, p_{22}, p_{23}, p_{24}, \ldots]^T$, $v_2(n)=[y_1(n)^2, y_1(n)^2|, y_1(n)^2, y_1(n)^2|y_1(n)|^2,$
$y_1(n)^6|y_1(n)|^6, \ldots]^T$, and $y_1(n)$ denotes a first input signal of the nonlinear power amplifier, wherein a degree of a polynomial of the predistorter can be determined by a designer), $$\varepsilon_{p_2} = |e_{p_2}(n)|^2 \quad (12\text{-}2)$$

(where $e_{p_2}(n) = 0 - \hat{w}_2^T u_2(n)$), and $$\hat{p}_2(n+1) = \hat{p}_2(n) - \frac{1}{2}\mu_{p_2} \frac{\partial \varepsilon_{p_2}(n)}{\partial p_2(n)} \quad (12\text{-}3)$$

$$= \hat{p}_2(n) - \frac{1}{2}\mu_{p_2} \frac{\partial y_2(n)}{\partial p_2(n)} \frac{\partial |e_{p_2}(n)|^2}{\partial y_2(n)}$$

$$= \hat{p}_2(n) - \frac{1}{2}\mu_{p_2} \left[ \frac{\partial y_2(n)}{\partial p_2(n)} \frac{\partial |e_{p_2}(n)|^2}{\partial y_2(n)} + \frac{\partial y_3(n)}{\partial p_2(n)} \frac{\partial |e_{p_2}(n)|^2}{\partial y_3(n)} \right]$$

$$= \hat{p}_2(n) - \frac{1}{2}\mu_{p_2} \left[ \frac{\partial y_2(n)}{\partial p_2(n)} \frac{\partial |e_{p_2}(n)|^2}{\partial y_2(n)} + \frac{\partial y_2(n)}{\partial p_2(n)} \frac{\partial y_3(n)}{\partial y_2(n)} \frac{\partial |e_{p_2}(n)|^2}{\partial y_3(n)} \right]$$

(where $\mu_{p_2}$ denotes a step size).

12. The digital predistortion device of claim 9, wherein the fundamental signal predistorter for compensating for nonlinear characteristics occurring in the fundamental signal, a cost function for obtaining a coefficient of the fundamental signal predistorter, and an adaptive coefficient algorithm for minimizing the cost function are respectively represented by the following Equations (13-1), (13-2), and (13-3) when N=3:

$$y_1(n) = p_1^T v_1(n) \quad (13\text{-}1)$$

(where $p_1 = [p_{11}, p_{12}, p_{13}, p_{14}, \ldots]^T$, $v_2(n) = [x(n), x(n)|x(n)|^2, x(n)|x(n)|^4, x(n)|x(n)|^6, \ldots]^T$, and x(n) denotes a transmission signal for a transmitter to be input to the fundamental signal predistorter, wherein a degree of a polynomial of the predistorter can be determined by the designer), $$\varepsilon_{p_1} = |e_{p_1}(n)|^2 \quad (13\text{-}2)$$

$$\left( \text{where } e_{p_1}(n) = x(n) - \hat{w}_1^T u_1(n) \right),$$
and $$\hat{p}_1(n+1) = \hat{p}_1(n) - \frac{1}{2}\mu_{p_1} \frac{\partial \varepsilon_{p_1}(n)}{\partial p_1(n)} \quad (13\text{-}3)$$

$$= \hat{p}_1(n) - \frac{1}{2}\mu_{p_1} \left[ \frac{\partial y_1(n)}{\partial p_1(n)} \frac{\partial |e_{p_1}(n)|^2}{\partial y_1(n)} + \frac{\partial y_2(n)}{\partial p_1(n)} \frac{\partial |e_{p_1}(n)|^2}{\partial y_2(n)} + \frac{\partial y_3(n)}{\partial p_1(n)} \frac{\partial |e_{p_1}(n)|^2}{\partial y_3(n)} \right]$$

$$= \hat{p}_1(n) -$$

$$\frac{1}{2}\mu_{p_1} \left[ \frac{\partial y_1(n)}{\partial p_1(n)} \frac{\partial |e_{p_1}(n)|^2}{\partial y_1(n)} + \frac{\partial y_1(n)}{\partial p_1(n)} \frac{\partial y_2(n)}{\partial y_1(n)} \frac{\partial |e_{p_1}(n)|^2}{\partial y_2(n)} + \frac{\partial y_1(n)}{\partial p_1(n)} \frac{\partial y_2(n)}{\partial y_1(n)} \frac{\partial y_3(n)}{\partial y_2(n)} \frac{\partial |e_{p_1}(n)|^2}{\partial y_3(n)} \right]$$

(where $\mu_{p_1}$ denotes a step size).

13. A digital predistortion method for broadband power amplifier, comprising:

(a) generating N input signals by a random signal generator;

(b) converting the N input signals, by Digital to Analog Converters (DACs), into analog signals;

(c) upconverting, by first mixers, the N input signals converted by the DACs;

(d) selecting, by real operators, real number signals from the N input signals upconverted by the first mixer;

(e) amplifying the N input signals and then generating N output signals, by a nonlinear power amplifier;

(f) receiving the N input signals and the N output signals and estimating characteristics of the nonlinear power amplifier by an equivalent amplifier model estimator;

(g) extracting, by a coefficient extractor, coefficients for N-1 harmonic elimination predistorters and a fundamental signal predistorter, using the characteristics of the nonlinear power amplifier estimated by the equivalent amplifier model estimator;

(h) eliminating second or higher harmonic signals from the N output signals by the N-1 harmonic elimination predistorters; and (i) the fundamental signal predistorter compensating for nonlinear characteristics occurring in a fundamental signal among the N output signals, by the fundamental signal predistorter.

14. The digital predistortion method of claim 13, further comprising, between (e) and (f):

(e-1) inputting the N output signals of the nonlinear power amplifier to second mixers and downconverting the N output signals by the second mixers;

(e-2) converting, by Analog to Digital Converters (ADCs), N output signals downconverted by the second mixers into digital signals; and (e-3) eliminating, by low pass filters, imagine signals from the N output signals converted into the digital signals.

15. The digital predistortion method of claim 13, wherein (g) comprises:

first extracting a coefficient of a harmonic elimination predistorter corresponding to a harmonic of a highest frequency among the N-1 harmonic elimination predistorters, and then extracting coefficients of harmonic elimination predistorters corresponding to harmonics of lower frequencies by stages; and extracting and fixing all coefficients of the N-1 harmonic elimination predistorters, and thereafter extracting a coefficient of the fundamental signal predistorter.

16. The digital predistortion device of claim 4, wherein cost functions for $W_1$, $W_2$, and $W_3$ indicating the characteristics of the nonlinear power amplifier are represented by the following Equation:

$$\epsilon_{w_1} = E\{|e_{w_1}(n)|^2\}, \epsilon_{w_2} = E\{|e_{w_2}(n)|^2\}, \epsilon_{w_3} = E\{|e_{w_3}(n)|^2\}$$

where $e_{w_1}(n) = a_1(n) - \hat{w}_1^T(n) u_1(i)$, $e_{w_2}(n) = a_2(n) - \hat{w}_2^T(n) u_2(n)$, $$e_{w_3}(n) = a_3(n) - \hat{w}_3^T(n) u_3(n),$$

and $\hat{w}_1(n)$, $\hat{w}_2(n)$, and $\hat{w}_3(n)$ denote estimation vectors of $W_1$, $W_2$, and $W_3$, respectively).

17. The digital predistortion device of claim 4, wherein cost functions for $W_1$, $W_2$, and $W_3$ indicating the characteristics of the nonlinear power amplifier are represented by the following Equation to derive a Least Mean Squares (LMS) algorithm:

$$\epsilon_{w_1} = |e_{w_1}(n)|^2, \epsilon_{w_2} = |e_{w_2}(n)|^2, \epsilon_{w_3} = |e_{w_1}(n)|^2$$

where $e_{w_1}(n) = a_1(n) - \hat{w}_1^T(n) u_1(i)$, $e_{w_2}(n) = a_2(n) - \hat{w}_2^T(n) u_2(n)$, $$e_{w_3}(n) = a_3(n) - \hat{w}_3^T(n) u_3(n),$$

and $\hat{w}_1(n)$, $\hat{w}_2(n)$, and $\hat{w}_3(n)$ denote estimation vectors of $W_1$, $W_2$, and $W_3$, respectively).

\* \* \* \* \*